United States Patent
Ray et al.

(10) Patent No.: US 11,418,163 B1
(45) Date of Patent: Aug. 16, 2022

(54) CONSTANT-BANDWIDTH LINEAR VARIABLE GAIN AMPLIFIER

(71) Applicant: Marvell Asia Pte, Ltd., Singapore (SG)

(72) Inventors: Sagar Ray, Fremont, CA (US); Jeffrey Wang, San Jose, CA (US); Karthik Raviprakash, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 16/898,838

(22) Filed: Jun. 11, 2020

(51) Int. Cl.
*H03F 3/45* (2006.01)
*H03G 1/00* (2006.01)
*H03F 3/72* (2006.01)

(52) U.S. Cl.
CPC .............. *H03G 1/0088* (2013.01); *H03F 3/72* (2013.01); *H03G 1/0029* (2013.01); *H03G 1/0082* (2013.01); *H03F 2200/294* (2013.01)

(58) Field of Classification Search
CPC .. H03G 1/0088; H03G 1/0029; H03G 1/0082; H03G 1/0023; H03G 1/0052; H03G 1/007; H03G 3/3015; H03F 3/72; H03F 2200/294; H03F 3/45183; H03F 2200/489; H03F 2200/492; H03F 2200/498; H03F 2203/45011
USPC .................................................. 330/254, 283
See application file for complete search history.

(56) References Cited

U.S. PATENT DOCUMENTS

| | | | | |
|---|---|---|---|---|
| 6,316,997 B1 * | 11/2001 | Tammone, Jr. | ...... | H03G 1/0029 330/254 |
| 7,034,606 B2 * | 4/2006 | Caresosa | ............ | H03F 3/45188 327/563 |
| 7,554,404 B2 * | 6/2009 | Roufoogaran | .......... | H03F 3/211 330/253 |
| 7,598,811 B2 * | 10/2009 | Cao | ..................... | H03F 3/45183 330/254 |
| 7,633,337 B2 * | 12/2009 | Nam | ........................ | H03F 1/42 330/86 |
| 7,701,288 B2 * | 4/2010 | Hou | .................... | H03F 3/45197 330/254 |
| 7,782,136 B2 * | 8/2010 | Kocaman | ............ | H03F 3/45197 330/254 |
| 9,825,626 B2 * | 11/2017 | Rahman | .............. | H04L 25/0272 |
| 10,027,297 B2 * | 7/2018 | Yuan | .................... | H03G 1/0023 |
| 10,958,230 B2 * | 3/2021 | Vera Villarroel | ......... | H03F 3/08 |

* cited by examiner

*Primary Examiner* — Khanh V Nguyen (57) ABSTRACT

The present invention is directed electrical circuits. According to a specific embodiment, the present invention provides a variable gain amplifier that includes a first switch, which includes drain terminal coupled to an inductor. A second switch is configured in parallel to the inductor, and the resistance value of the second switch is adjustable in response to a control signal. There are other embodiments as well.

16 Claims, 11 Drawing Sheets

CONSTANT-BANDWIDTH LINEAR VARIABLE GAIN AMPLIFIER

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to electrical circuits.

A variable gain amplifier (VGA) has many applications. Typically, variable-gain or voltage-controlled amplifier is an electronic amplifier that varies its gain depending on a control voltage (CV). VGAs have many applications, including data communication, audio level compression, synthesizers, amplitude modulation, and others. For example, a VGA can be implemented by first creating a voltage-controlled resistor (VCR), which is used to set the amplifier gain. The VCR can be produced by one or more transistors with simple biasing. In certain implementation, VGAs are implemented using operational transconductance amplifiers. Sometimes, VGAs are implemented for automatic gain control (AGC) applications. Typically, VGA performance can be measured in terms of gain range, linearity of electrical characteristics, distortion, tunabiltiy, and bandwidth.

Over the past, many types of conventional variable gain amplifiers have been proposed and implemented in different applications. Unfortunately, existing variable gain amplifiers are inadequate, as explained below. It is thus desirable to have new and improved variable gain amplifiers.

BRIEF SUMMARY OF THE INVENTION

The present invention is directed electrical circuits. According to a specific embodiment, the present invention provides a variable gain amplifier that includes a first switch, which includes drain terminal coupled to an inductor. A second switch is configured in parallel to the inductor, and the resistance value of the second switch is adjustable in response to a control signal. There are other embodiments as well.

According to an embodiment, the present invention provides a variable gain amplifier device, which includes a first switch comprising a first gate terminal and a first drain terminal. The first gate terminal is coupled to a first input voltage. The device also includes a second switch comprising a second gate terminal and a second drain terminal. The second gate terminal is coupled to a second input voltage. The device also includes a first output terminal coupled to the first drain terminal. The device additionally includes a second output terminal coupled to the second drain terminal. The device further includes a first inductor coupled to the first drain terminal. The device additionally includes a second inductor coupled to the second drain terminal. The device further includes a third switch comprising a third gate terminal and configured in parallel to the first inductor. The device additionally includes a fourth switch comprising a fourth gate terminal and configured in parallel to the second inductor.

According to another embodiment, the present invention provides a variable gain amplifier device, which includes a first switch comprising a first base terminal and a first collector terminal. The first base terminal is coupled to a first input voltage. The device further includes a second switch comprising a second base terminal and a second collector terminal. The second base terminal is coupled to a second input voltage. The device additionally includes a first output terminal coupled to the first collector terminal. The device further includes a second output terminal coupled to the second collector terminal. The device also includes a first inductor coupled to the first collector terminal. The device additionally includes a second inductor coupled to the second collector terminal. The device also includes a third switch comprising a first gate terminal and configured in parallel to the first inductor. The device also includes a fourth switch comprising a second gate terminal and configured in parallel to the second inductor.

According to yet another embodiment, the present invention provides a receiver apparatus, which includes an input terminal for receiving incoming data signals. The receiver apparatus also includes a variable gain amplifier coupled to the input terminal. The variable gain amplifier includes a first switch and an inductor. The input switch is coupled to the input terminal. The input switch includes a source terminal coupled to a variable resistor and a drain terminal coupled to the inductor. The variable resistor is coupled to a first control signal. The variable gain amplifier further includes a second switch configured in parallel to the inductor. The second switch is coupled to second control signal. The apparatus also includes an analog to digital converter (ADC) configured to generate digital signal based on the incoming data signal, the ADC being coupled to the drain terminal.

It is to be appreciated that embodiments of the present invention provide many advantages over conventional techniques. Among other things, variable gain amplifiers according to the present invention can effectively improve device linearity and bandwidth, while providing large gain control range. When incorporated into various types of communication systems, amplifier according to the present invention can effectively improve overall system performance.

Embodiments of the present invention can be implemented in conjunction with existing systems and processes. For example, variable gain amplifiers and communication systems according to the present invention can be manufactured using existing manufacturing equipment and techniques. Additionally, embodiments of the present invention can be readily adopted into existing communication and other applications.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed electrical circuits. According to a specific embodiment, the present invention provides a variable gain amplifier that includes a first switch, which includes drain terminal coupled to an inductor. A second switch is configured in parallel to the inductor, and the resistance value of the second switch is adjustable in response to a control signal. There are other embodiments as well.

Figure 1:
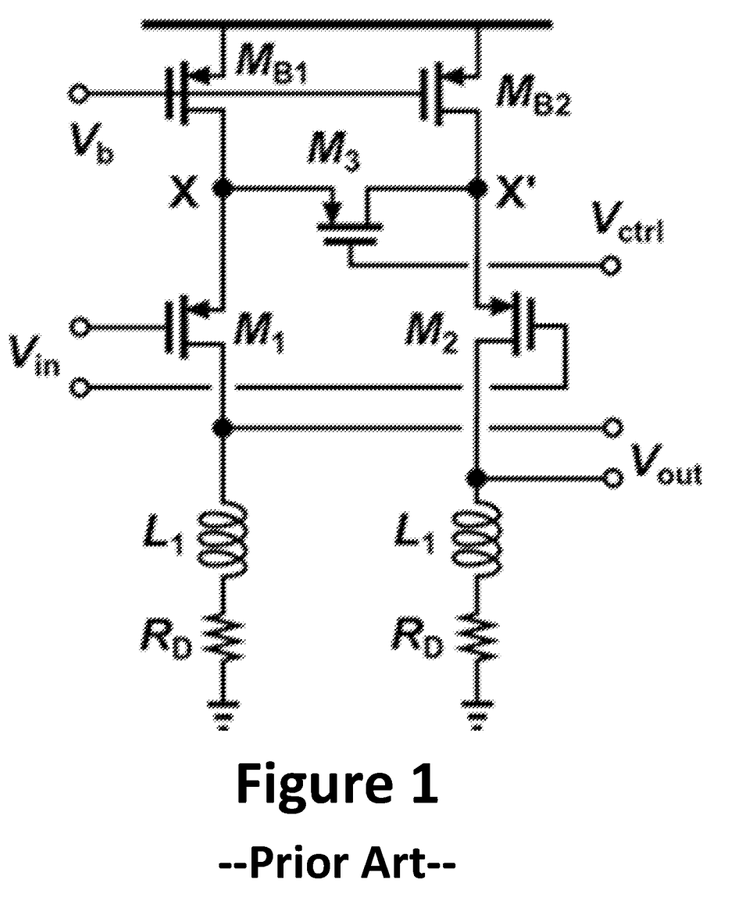
FIG. 1 is a diagram illustrating a conventional variable gain amplifier.

As mentioned above, conventional VGAs are inadequate. FIG. 1 is a diagram illustrating a conventional VGA. The VGA in FIG. 1 is configured as a source degeneration VGA that provides a good compromise among power dissipation, linearity, and simplicity. To achieve a high gain with large gain control range, the degeneration device (switch $M_3$) is typically designed to be large. The parasitic capacitance at node X (or X')—arising from the large dimension of $M_3$ and added to the capacitive contribution of $M_{B,1-2}$ and $M_{1,2}$, thereby creating a zero in the overall VGA transfer function—can be expressed as:

$$f_z = \frac{K(V_X - V_{ctrl})}{2\pi C_X} \quad \text{Equation 1:}$$

where, $V_X$ is the DC voltage at X (or X') reduced by the threshold voltage of $M_3$; $C_X$ is the total capacitance at node X (or X') and K is a constant. Equation 1 indicates that the zero frequency moves closer to origin for lower VGA gain (i.e., $V_{ctrl}$ is high), and may enter the signal band of interest, thereby creating undesired peaking and/or bandwidth extension. The unintended peaking and bandwidth extension may result in sub-optimal utilization of the full-scale range (FSR) in analog-to-digital converter (ADC) based receiver system due to the extra transient peaking, and they can cause unnecessary increase in noise or group-delay variation. Moreover, the unintended peaking and bandwidth extension create difficulty in equalization systems that prefer a constant bandwidth as the gain changes.

There are some conventional solutions that address the variation of bandwidth over gain range of the VGA, such as Gilbert VGA, which has minimal bandwidth variation when implemented in CMOS technologies. A Gilbert VGA uses the current steering gain control mechanism that does not vary the impedances in the signal path, unlike the topology illustrated in FIG. 1. However, a Gilbert VGA, compared to the VGA in FIG. 1, is significantly more power hungry and may require higher voltage supply due to stacked devices. There are other conventional VGA designs, but unfortunately each with their own shortcomings.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2A:
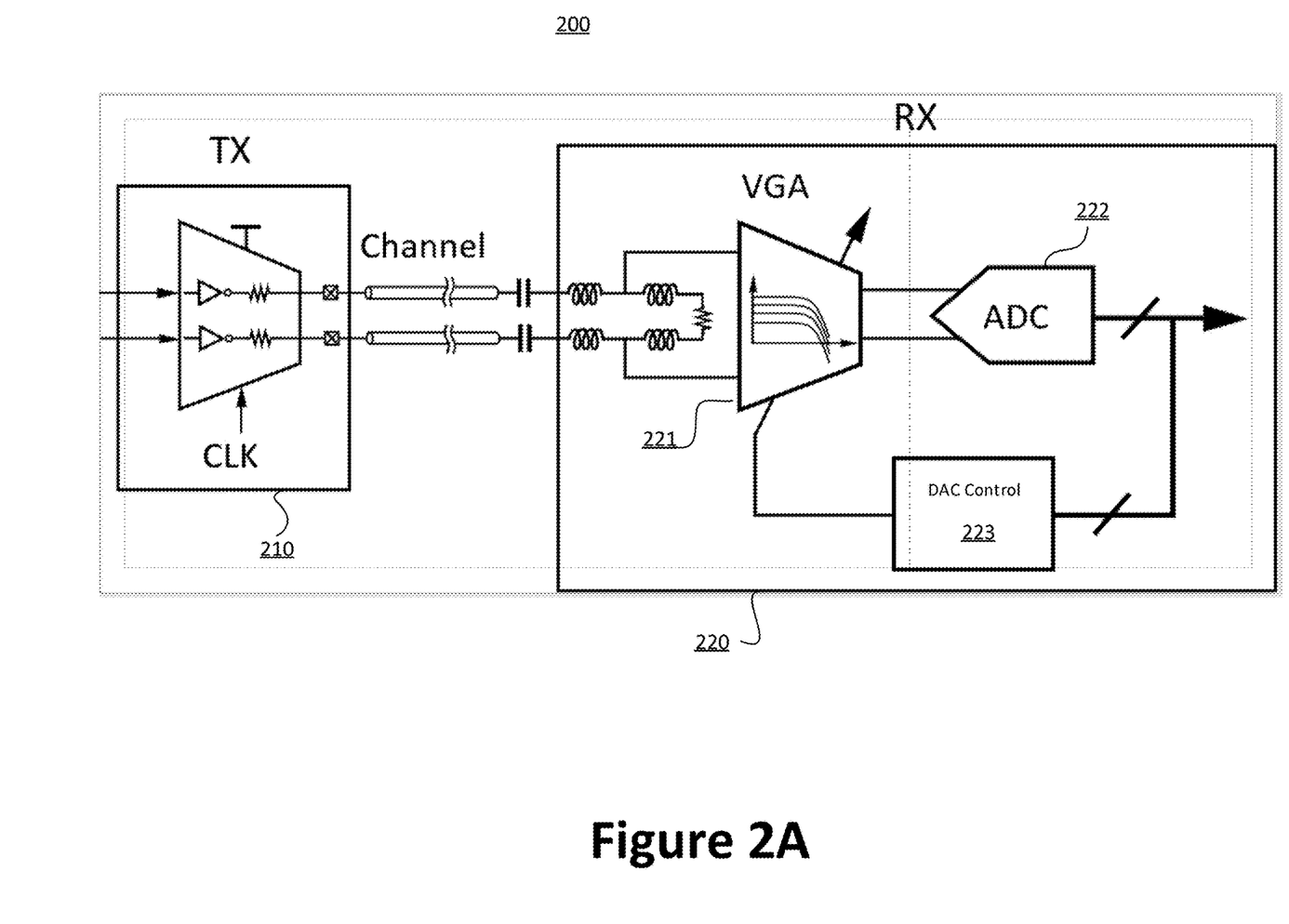
FIG. 2A is a simplified diagram illustrating a communication system according to embodiments of the present invention.

FIG. 2A is a simplified diagram illustrating a communication system 200 according to embodiments of the present invention. This diagram is merely an example, which should not unduly limit the scope of the claims. One of ordinary skill in the art would recognize many variations, alternatives, and modifications. Communication system 200 includes a transmitter 210 and a receiver 220. The data from transmitter 210 to receiver 220 is transmitted via the communication channel as shown. For example, the communication channel comprises electrical wires configured to allow electrical signals to travel from transmitter 210 to receiver 220. It is to be understood that transmitter 210 and receiver 220 are used here to provide an example, and they may be implemented as various types of network entities. For example, transmitter 210 and receiver 220 are both network entities that are capable of transmitting and receiving data, and they transceivers, data source, serializer/deserializer, and/or other network entities. Receiver 220 includes VGA 221, implemented according to embodiments of the present invention, that adjusts the gain of incoming electrical signals. The gain level of VGA 221 is based a control signal generated by DAC Control 223. The amplified signal from VGA 221 is digitized by analog-to-digital converter 222 for processing in digital domain. VGA 221 receives from controller 223 a control signal that adjusts the gain level. Receiver 220 includes other components as well, such as timing recovery circuit, digital signal processing circuit, equalizer circuits, and/or others. Since VGA 221 is one of the first circuits that process the received signal, it is desirable for output of VGA 221 to be as clean as possible, which requires, among other things, a high level of linearity over a large operating bandwidth. It is to be appreciated that VGA 221, as implemented according to embodiments of the present invention, can provide substantially constant bandwidth and highly linear output.

It is to be appreciated that VGAs have are widely implemented in various implementation of transceiver (TX and RX) systems, such as the system 200 (e.g., the VGA is used in the front end of an ADC based electrical receiver). Due to the variations in the transmitted and received signal, the amplified output from the VGA may saturate the ADC input. If the ADC senses that its full-scale-range (FSR) is being utilized consistently, it attempts to reduce the VGA gain via DAC control, forming an automatic gain-control (AGC) loop.

Figure 2B:
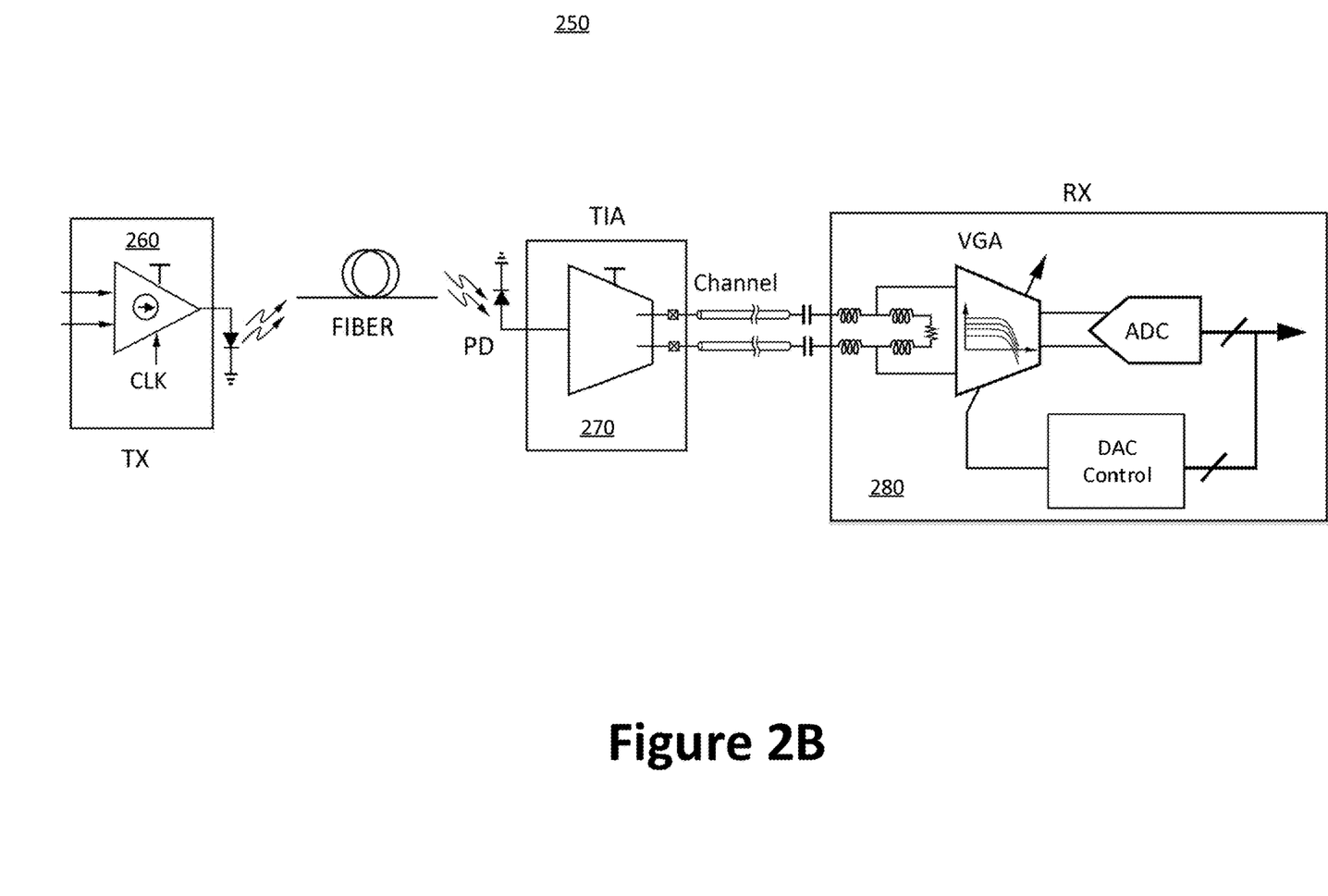
FIG. 2B is a simplified diagram illustrating an optical communication system according to embodiments of the present invention.

FIG. 2B is a simplified diagram illustrating an optical communication system 250 according to embodiments of the present invention. This diagram is merely an example, which should not unduly limit the scope of the claims. One of ordinary skill in the art would recognize many variations, alternatives, and modifications. Transmitter 260 is configured to transmit data, in optical format, through the optical (e.g., fiber) channel as shown to receiver 280. For example, pulse-amplification modulation (PAM) protocol is used for transmission through optical channel. Transimpedance amplifier (TIA) 270 is configured as a part of receiver 280, which converts optical signal to electrical signal. The VGA of receiver 280 is configured to adjust gain of the electrical signal generated by TIA 270. The ADC digitizes the output of VGA. As explained above, it is important for the VGA to provide substantially linear output over a large operating bandwidth. In various embodiments, the VGA gain is adjusted by the output of the DAC control as shown. The VGA in FIG. 2B is configured with a bandwidth extension mechanism as described below.

Figure 3A:
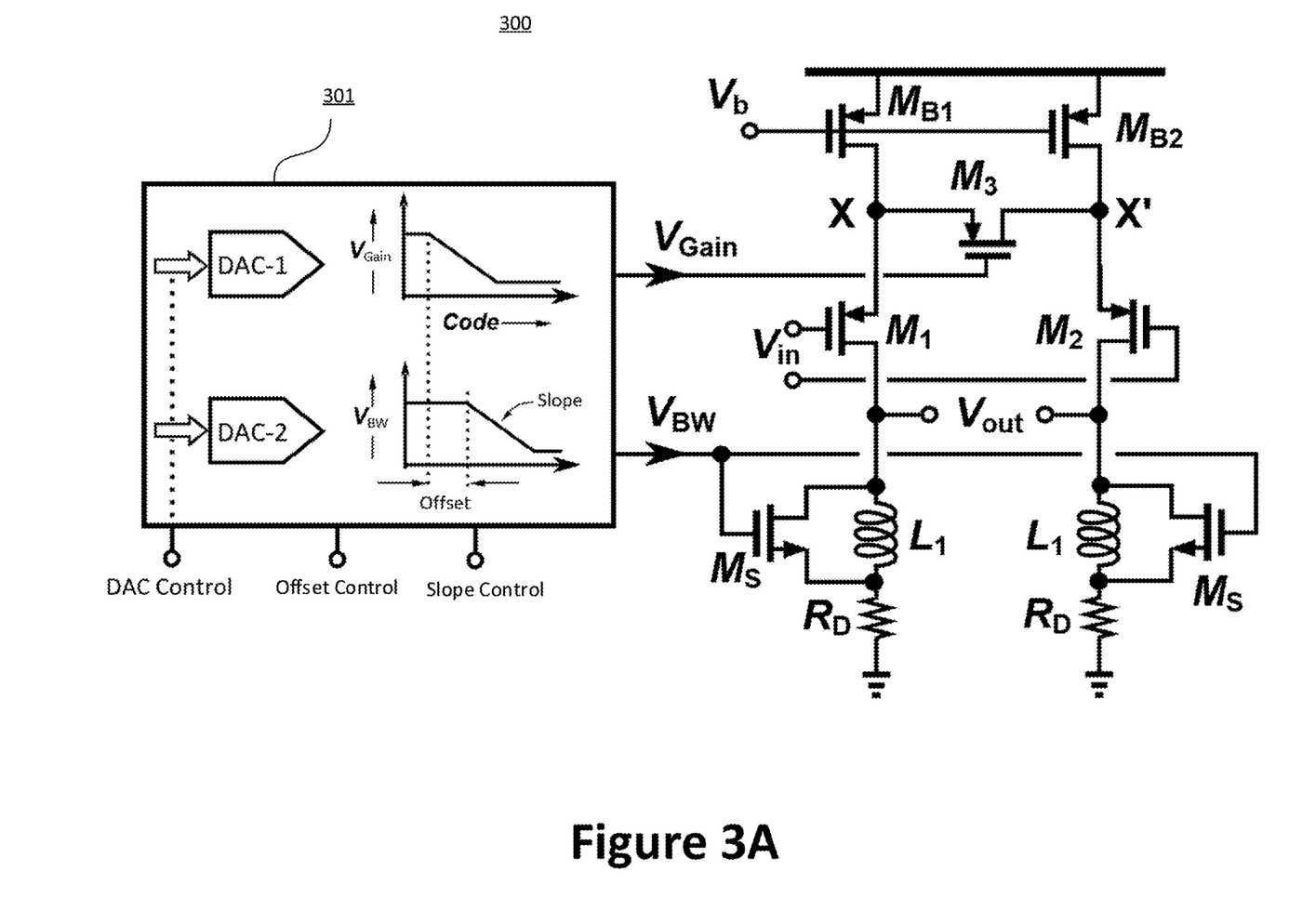
FIG. 3A is a simplified diagram illustrating an NMOS-based differential amplifier according to embodiments of the present invention.

FIG. 3A is a simplified diagram illustrating an NMOS-based VGA 300 according to embodiments of the present invention. This diagram is merely an example, which should not unduly limit the scope of the claims. One of ordinary skill in the art would recognize many variations, alternatives, and modifications. VGA 300 is configured as a differential amplifier with differential inputs and differential outputs. Switches $M_1$ and $M_2$ are input switches for receiving differential input signals. In FIG. 3A, switches $M_1$ and $M_2$ are both implemented with NMOS transistors, and VGA 300 is referred to as NMOS based differential amplifier. As described below, input switches can be implemented with PMOS, BJT, or other types of switches.

The gain of VGA 300 can be adjusted by changing gate voltage of switch $M_3$. Configured between nodes X and X' (respectively source terminals of switches $M_1$ and $M_2$), switch $M_3$ functions as a variable resistor. Signal $V_{gain}$ effectively acts as the gain control signal that adjusts the gain of VGA 300 by changing effective resistance of switch $M_3$. As an example, DAC-1, implemented as a part of control module 301, generates signal $V_{gain}$ based on the received DAC control code. For example, control module 301 uses DAC control code, an offset control signal, and a slope control signal.

Bias switches $M_{B1}$ and $M_{B2}$, both NMOS switches, are respectively coupled to source terminals of $M_1$ and $M_2$ and a supply voltage. The gate terminals of switches $M_{B1}$ and $M_{B2}$ are coupled to bias voltage Vb.

Differential input signals $V_{in}$ are coupled to gate terminals of switches $M_1$ and $M_2$. The differential outputs $V_{out}$ are coupled to drain terminals of switches $M_1$ and $M_2$. Inductors $L_1$ (one on each side) and resistors $R_D$ (also one on each side) are respectively coupled to the drain terminals of input switches $M_1$ and $M_2$. Switches $M_s$ as shown are configured in parallel with the $L_1$ inductors (which are configured as bandwidth defining inductors) as shown, and their gate terminals are coupled to signal $V_{BW}$. Switches $M_s$ provide bandwidth extension for VGA 300. Switches $M_s$ effectively function as variable resistor whose resistance values are adjust by signal $V_{BW}$. As an example, DAC-2 generates signal $V_{gain}$, which is associated with an offset signal and a slope control signal. The impedance value of switches $M_s$ is control voltage dependent. For example, as impedance value of $M_s$ switches approaches infinity, $L_1$ inductors is close to 100% effective; as impedance value of $M_s$ switches approaches zero, $L_1$ inductors are substantially bypassed. By adjusting $L_1$ effectiveness, $M_s$ switches implements a mechanism to control bandwidth for VGA 300.

Figure 3B:
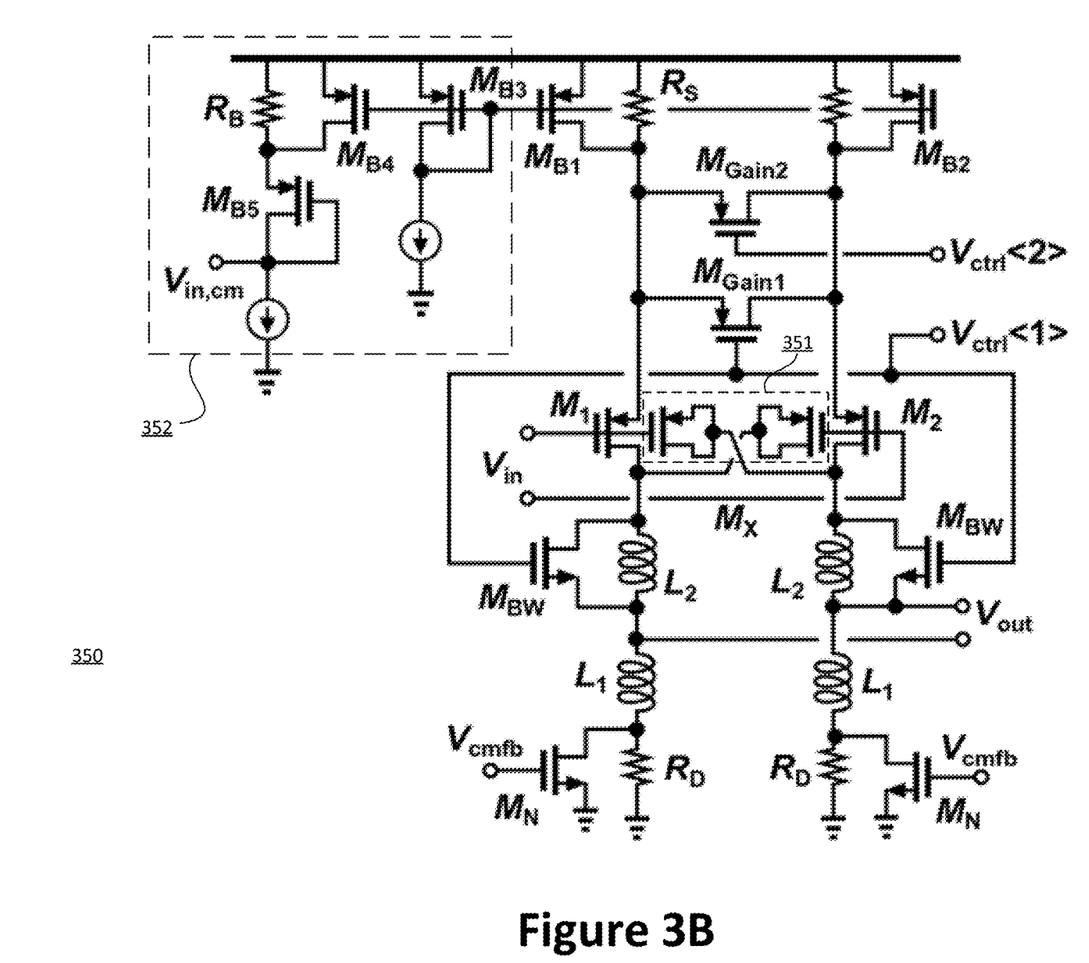
FIG. 3B is a simplified diagram illustrating an NMOS-based VGA with voltage supply according to embodiments of the present invention.

FIG. 3B is a simplified diagram illustrating an NMOS-based VGA 350 with voltage supply according to embodiments of the present invention. This diagram is merely an example, which should not unduly limit the scope of the claims. One of ordinary skill in the art would recognize many variations, alternatives, and modifications. VGA 350 is characterized by a similar architecture as VGA 300, but it has additional components and different configurations. A cross-coupled device combination ($M_X$) 351 is used to cancel a part of the Miller capacitance of the VGA 350 (e.g., present at $V_{in}$). This ensures a constant capacitive load seen by the source driving the VGA 350 irrespective of its gain, resulting in gain-independent BW at the input side of the VGA 350.

VGA 350 includes bias circuit 352 as shown. The biasing network, which includes $M_{B1-5}$ and $R_B$, is used to replicate the main VGA 350, albeit at a lower scale to reduce power dissipation. More specifically, $M_{B3}$ is used to bias $M_{B,1-2}$, while $M_{B,4-5}$ along with $R_B$ are used to establish a common mode voltage ($V_{in,cm}$) for the input differential signal, $V_{in}$ so that a fixed biasing current can be established through $M_{1,2}$.

The gain of VGA 350 depends on the impedance of switches $M_{Gain1}$ and $M_{Gain2}$. Signal $V_{control}$ <2> provides gain control voltage for switch $M_{Gain2}$. Signal $V_{control}$ <1> functions as both gain control voltage (i.e., coupled to switch $M_{gain}$) and as bandwidth extension voltage (i.e., coupled to gates of $M_{BW}$ switches). It is to be noted that $V_{control}$ <1> and $V_{control}$ <2> are used to control $M_{Gain1}$ and $M_{Gain2}$ respectively, which means that the lower gain control branch $M_{Gain2}$ can be designed separately from the higher gain control branch $M_{Gain1}$. M Instead of the weak gain control branch $M_{Gain2}$, the stronger gain control branch $M_{Gain1}$ is used in conjunction with the proposed bandwidth tuning technique (e.g., using switch $M_{BW}$). In various implementations, $M_{Gain1}$ provide a bigger portion of the gain control range that affects bandwidth, as compared to that of $M_{Gain2}$. This allows to decouple linearity from VGA gain-range, and each can be optimized separately. $L_1$ inductors are configured in series with their respective $L_2$ inductors. Gate terminals of common mode feedback switches $M_N$ are coupled to signal $V_{cmfb}$, and the drain terminals of $M_N$ switches are coupled between $L_1$ inductors and $R_D$ resistors. The resistor and NMOS combination ($R_D$ and $M_N$) is configured at the load side of the VGA 350. The resistor $R_D$ is needed to establish the output biasing voltage as well as the DC gain of the VGA. The parallel NMOS device ($M_N$) is used to both reduce voltage drop across $R_D$, (which increases $V_{GD}$ for $M_{1,2}$ and thereby, linearity) and serve as part of the common-mode feedback (CMFB) network.

The resistor and PMOS biasing combination (i.e., $R_S$ and $M_{B,1-2}$), configured with bias circuit 352, is to reduce noise as well as to increase voltage headroom for the input differential pairs ($M_{1,2}$). The increase of voltage headroom (by using $M_{B,1-2}$) results in higher gate-to-drain voltage ($V_{GD}$) for $M_{1,2}$. This greatly improves VGA linearity by reducing output impedance modulation of $M_{1,2}$ w.r.t. the output swing. Additionally, using resistance ($R_S$) allows $M_{B,1-2}$ to be smaller, thereby reducing their noise contribution.

To achieve substantially constant bandwidth at different gain control settings, a continually tunable resistance ($M_{BW}$) is configured in parallel to the bandwidth defining inductor, $L_2$, as shown in FIG. 3B. The use of a resistor in parallel to an inductor reduces the effectiveness of inductor in presenting a higher impedance to higher frequency components, thereby decreasing the bandwidth. For example, the resistance value of switch $M_{BW}$ is $R_s$. Quantitatively, the impedance of resistor ($R_S$) and inductor ($L_2$) configured in parallel can be expressed in Equation 2 below:

Equation 2:

$$Z_{L2}(j\omega) = \frac{R_S(\omega L_2)^2}{R_{S2} + (\omega L_2)^2} + j\frac{R_S^2 \omega L_2}{R_{S2} + (\omega L_2)^2} \quad (2)$$

Equation 2 indicates that for large values of $R_S$ ($R_S \gg \omega L_2$), the impedance is reduced to $Z_{L2}(j\omega) \approx j\omega L_2$, indicating that the inductance is not affected by $R_S$. On the other hand, for smaller value of $R_S$, the inductance vanishes since $Z_{L2}(j\omega) \approx R_S$ for $R_S \ll \omega L_2$. Therefore, if the bandwidth is a strong function of $L_2$, then tuning $R_S$ will tune the bandwidth.

Figure 4:
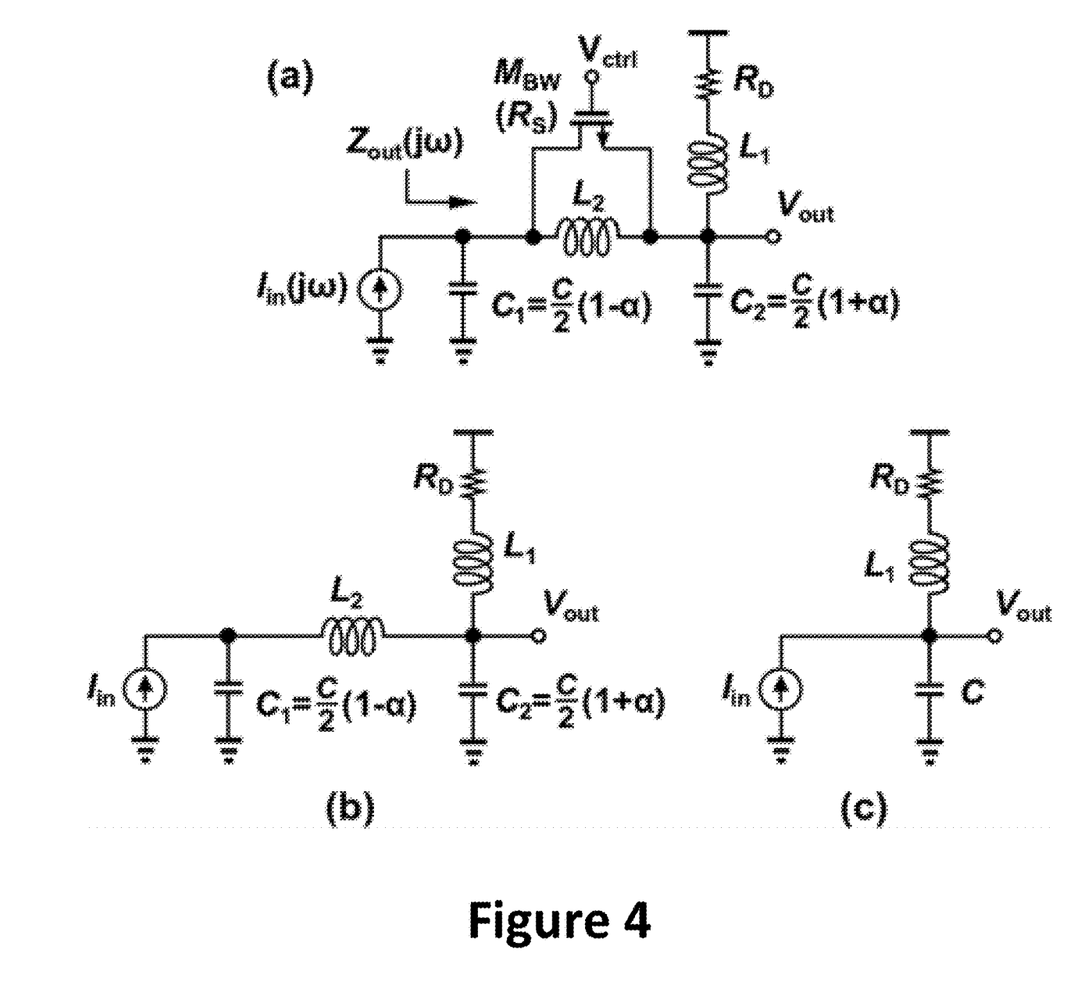
FIG. 4 provide circuit models of VGA circuits according to embodiments of the present invention.

FIG. 4 provide circuit models of VGA circuits according to embodiments of the present invention. This diagram is merely an example, which should not unduly limit the scope of the claims. One of ordinary skill in the art would recognize many variations, alternatives, and modifications. For example, a simplified model of the VGA 350 is shown in FIG. 4(*a*), which encapsulates the variation of the zero frequency w.r.t. control voltage (e.g., described in Equation 1) inside the frequency dependent current source model of $M_{1,2}$ ($I_{in}$). For large $R_S$, the amplifier model is reduced to that of a fixed gain amplifier, as shown in FIG. 4(*b*). For an uneven output capacitor loading at the near and far end of the VGA (i.e., capacitors $C_1$ and $C_2$, where $C_1$ is the near end loading arising at the drain nodes of input switches $M_{1,2}$ and $C_2$ is the capacitance from the next stage), it has been shown that the specific configuration of $L_1$ & $L_2$ in FIG. 4(*b*) yields the highest bandwidth when $C_2 > C_1$. For example, for a split ratio of $\alpha = 0.25$ and $R_S \to \infty$, it can be shown that the maximum achievable bandwidth of the proposed architecture is $$BW_{Max} \approx \frac{4}{2\pi R_D C},$$

where $C = C_1 + C_2$ and $R_D$ is the drain resistance (to put the result into perspective, the bandwidth would only be $1/2\pi R_D C$ if no inductor was used). Here it is assumed that the DC impedance ($R_D$) is maintained at the first resonance frequency of the π-network $$\left(\frac{1}{2\pi\sqrt{L_2 C_1}}\right),$$

which, in turn is assumed to be equal to the resonance frequency of a shunt peaked amplifier—as shown FIG. 4(*c*)—is used for specific implementations. The values for $L_1$ & $L_2$ can then be derived from these two boundary conditions for a given loading condition ($R_D$, $C_1$ and $C_2$).

A practical implementation of $R_S$ is using a linear mode NMOS (e.g., switch $M_{BW}$ as shown in FIGS. 3A and 3B), which yields an inverse relationship between $V_{ctrl}$ and bandwidth, meaning that the dominant pole will decrease as $V_{ctrl}$ increases. As a result, this pole can be used to cancel the zero arising from $C_X$ (e.g., see FIG. 1) to yield substantially constant overall BW, since both the pole and zero decreases with increasing control voltage (e.g., see Equation 1).

Figure 5:
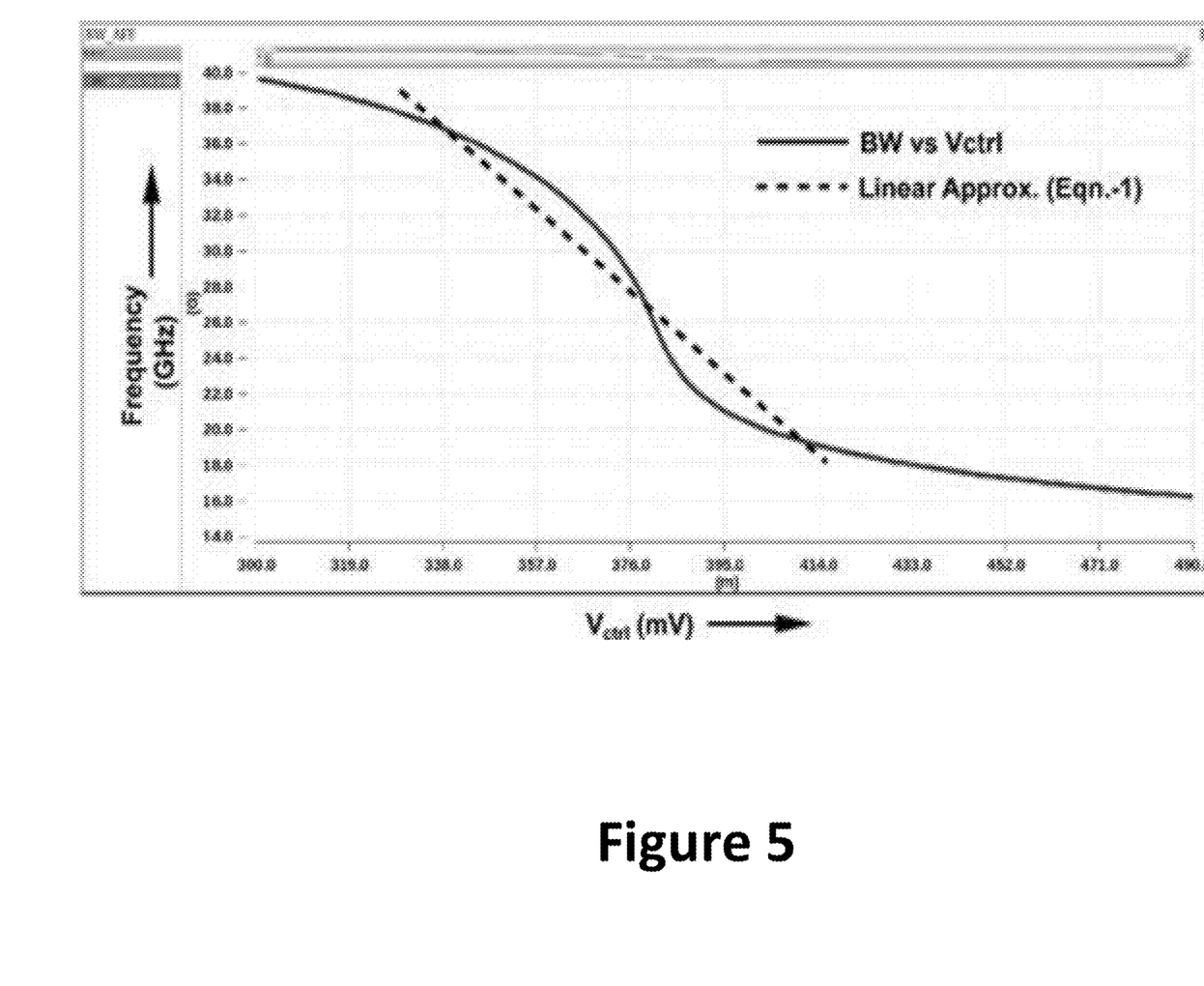
FIG. 5 provides a plot illustrating bandwidth of a VGA circuit according to embodiments of the present invention.
Figure 6:
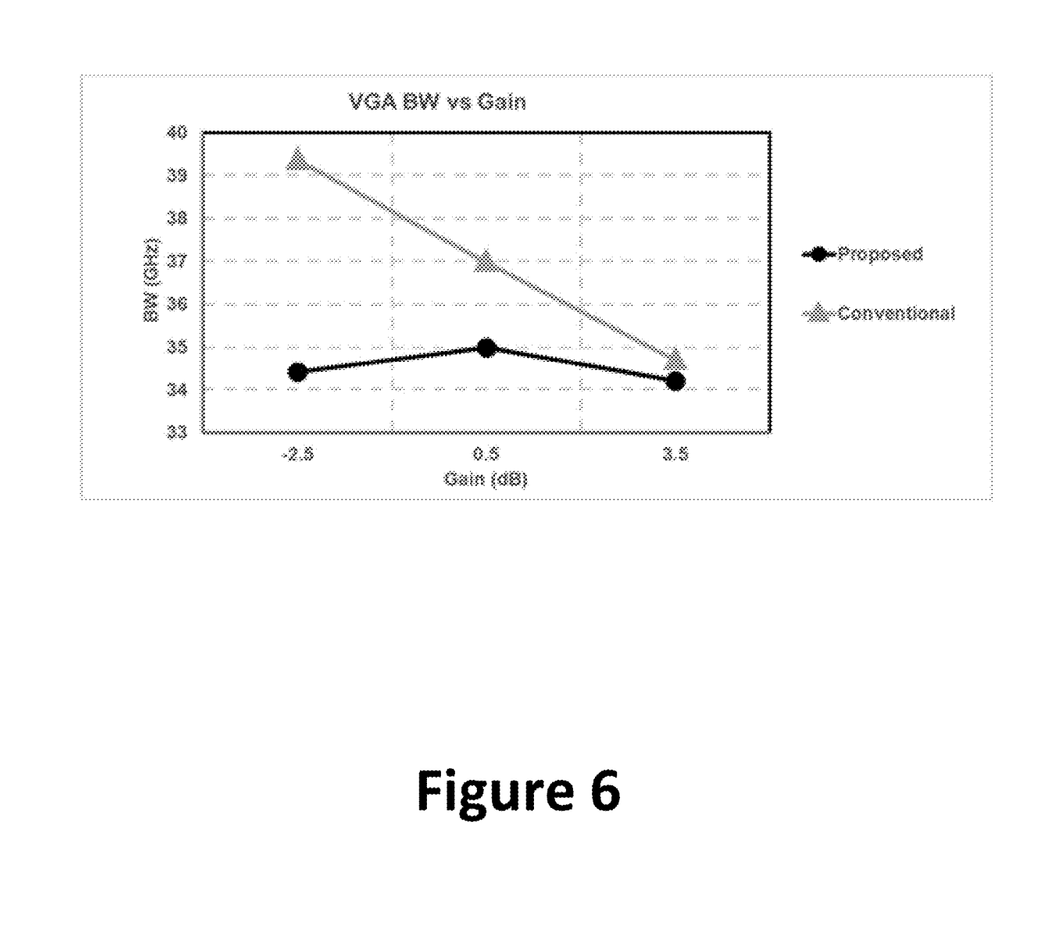
FIG. 6 provides a plot illustrating the relationship between bandwidth and gain of a VGA circuit according to embodiments of the present invention.

It is to be appreciated that there are implementation challenges arise beyond the simplistic assumptions stated above. First, due to the complicated relationship between the bandwidth and $V_{ctrl}$, the bandwidth control curve of $Z_{out}$—of model illustrated in FIG. 4(*a*)—is highly non-linear as shown in the simulation results in FIG. 5. FIG. 5 provides a plot illustrating bandwidth of a VGA circuit according to embodiments of the present invention. It is possible to counteract the non-linearity by inserting an inverse function to the non-linear relation between $V_{ctrl}$ and $M_{BW}$, which can be implemented using a DAC, or other means. However, the compensated BW variations in various implementations (e.g., as illustrated in FIG. 3A and FIG. 3B) arising from the non-linear control curve is small (e.g., as illustrated in FIG. 6), and may be acceptable for most applications. FIG. 6 provides a plot illustrating the relationship between bandwidth and gain of a VGA circuit according to embodiments of the present invention.

Anther implementation challenge arises if the simplistic control architecture—as illustrated in the FIG. 3B example—is adopted (where the same control voltage, $V_{ctrl}$ is used to control both gain and bandwidth). It is needed to center the control curves for both pole (e.g., see FIG. 5) and the parasitic zero (e.g., see Equation 1) so that a linear approximation for pole-zero cancellation in the region of interest is achieved (similar to the dotted line in FIG. 5). In various embodiment, the present invention provides a technique of aligning the center that uses different threshold voltage device for NMOS ($M_{BW}$) and PMOS ($M_{Gain1}$). For certain implementation, a Monte-Carlo simulation on the architecture reveals that the mismatch arising due to with choice is suitable for certain implementations. It is worth mentioning that the slope of the control curve can be adjusted to match Equation 1 by properly sizing the NMOS device ($M_{BW}$) with respect to the PMOS device ($M_{Gain1}$).

Figure 7:
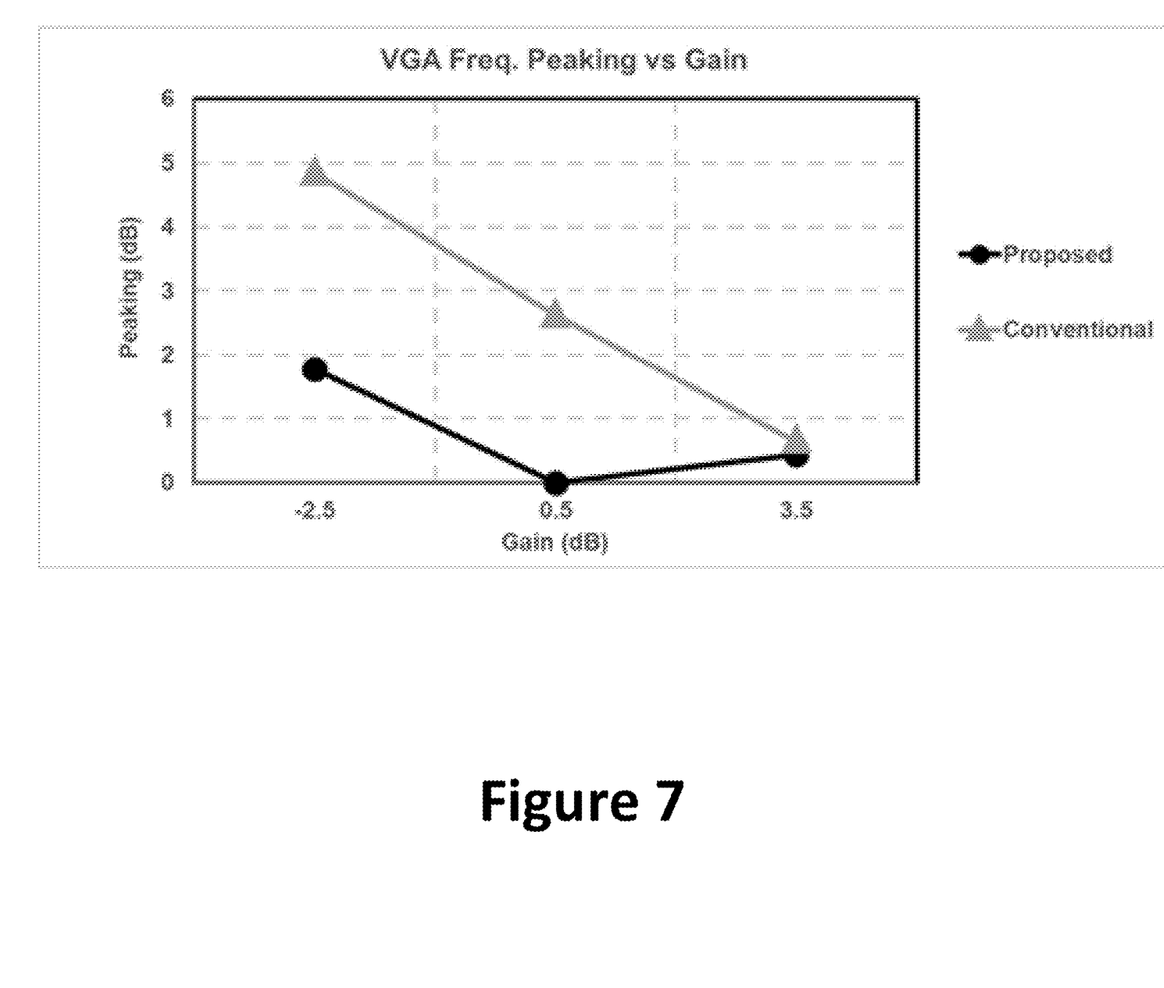
FIG. 7 provides a plot illustrating the relationship between frequency peaking and gain of a VGA circuit according to embodiments of the present invention.

The results of the proposed technique are illustrated in FIGS. 6 and 7, indicating that the proposed technique reduces the BW variation by about 12% and suppresses peaking from 5 dB to <2 dB. FIG. 7 provides a plot illustrating the relationship between frequency peaking and gain of a VGA circuit according to embodiments of the present invention. It is also worth mentioning that the application of the proposed inductor tuning technique is not just limited to the above architectures (e.g., VGA 300 and VGA 350), but can also be extended to the commonly used triple-resonance network (TRN) and shunt peaking VGA architectures and their NMOS counterparts.

Figure 8:
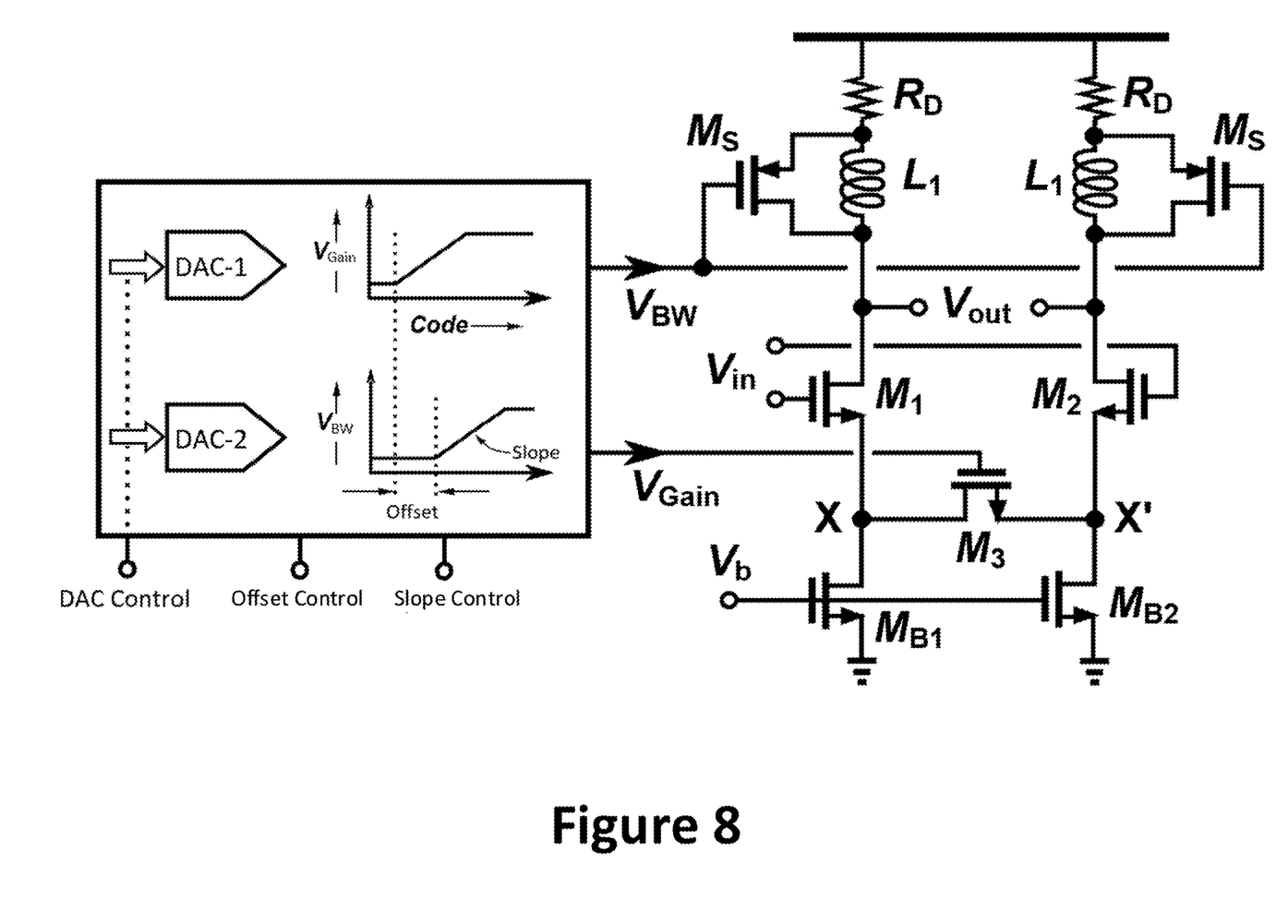
FIG. 8 is a simplified diagram illustrating a PMOS based VGA according to embodiments of the present invention.

FIG. 8 is a simplified diagram illustrating a PMOS based VGA according to embodiments of the present invention. This diagram is merely an example, which should not unduly limit the scope of the claims. One of ordinary skill in the art would recognize many variations, alternatives, and modifications. As an example, input switches $M_1$ and $M_2$ are implemented with PMOS switches, and the differential amplifier is configured accordingly. $M_S$ switches are configured in parallel relative the $L_1$ inductors as shown. A control module—with DAC control, offset control, and slope control—provides control signal $V_{BW}$ and control signal $V_{Gain}$. $V_{BW}$ adjusts impedance value of switches $M_S$, which affects the effectiveness of $L_1$ inductors. $V_{Gain}$ adjusts the impedance value of switch $M_3$, which affects the gain of the VGA. VGA in FIG. 8 also includes drain resistors $R_D$ and bias switches $M_{B1}$ and $M_{B2}$.

Figure 9:
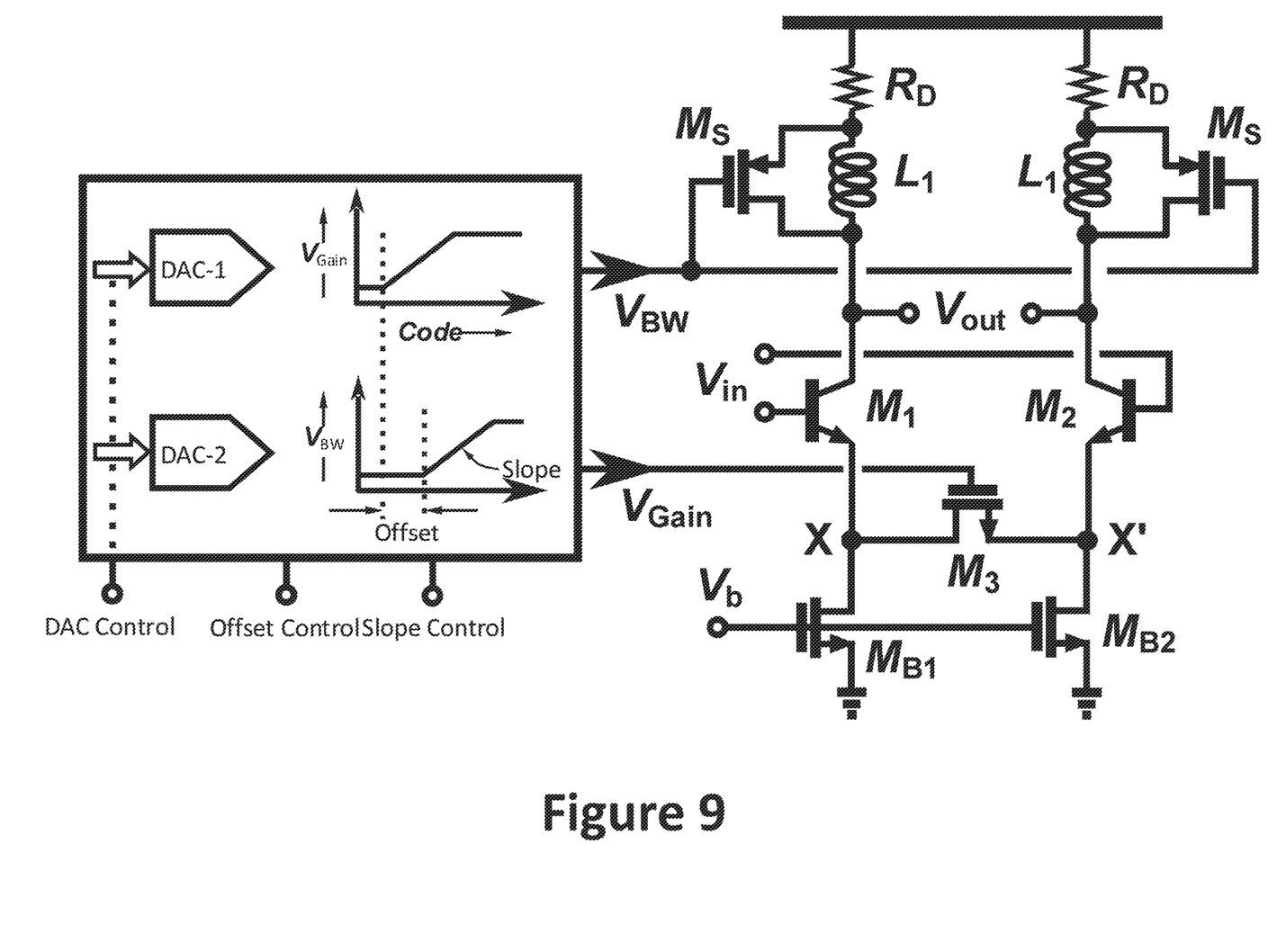
FIG. 9 is a simplified diagram illustrating a BJT based VGA according to embodiments of the present invention.

FIG. 9 is a simplified diagram illustrating a BJT based VGA according to embodiments of the present invention. This diagram is merely an example, which should not unduly limit the scope of the claims. One of ordinary skill in the art would recognize many variations, alternatives, and modifications. As an example, input switches $M_1$ and $M_2$ are implemented with bipolar junction transistor (BJT) switches, and the differential amplifier is configured accordingly. $M_S$ switches are configured in parallel relative the $L_1$ inductors as shown. A control module—with DAC control, offset control, and slope control—provides control signal $V_{BW}$ and control signal $V_{Gain}$. $V_{BW}$ adjusts impedance value of switches $M_S$, which affects the effectiveness of $L_1$ inductors. $V_{Gain}$ adjusts the impedance value of switch $M_3$, which affects the gain of the VGA. VGA in FIG. 8 also includes resistors $R_D$ and bias switches $M_{B1}$ and $M_{B2}$. It is to be appreciated that there are certain advantages associated with BJT based (i.e., with BJT as input switches) VGAs. For example, BJT switches can offer higher speed and gain compared to CMOS switches, but BJT switches cannot be used to implement a voltage-controlled resistor (i.e., used to implemented switches $M_S$ and $M_3$). In various embodiments, a VGA implemented BJT devices and CMOS devices can be manufactured in available processes.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A variable gain amplifier comprising:
   a first switch comprising a first gate terminal and a first drain terminal, the first gate terminal being coupled to a first input voltage of a differential input signal;
   a second switch comprising a second gate terminal and a second drain terminal, the second gate terminal being coupled to a second input voltage of the differential input signal;
   a first output terminal coupled to the first drain terminal;
   a second output terminal coupled to the second drain terminal;
   a first inductor coupled to the first drain terminal;
   a second inductor coupled to the second drain terminal;
   a third switch comprising a third gate terminal and coupled in parallel with the first inductor;
   a fourth switch comprising a fourth gate terminal and coupled in parallel with the second inductor, the third switch and the fourth switch receiving, from a control module, a bandwidth control signal that varies a bandwidth of the variable gain amplifier; and
   a fifth switch that receives, from the control module, a gain control signal that varies a gain of the variable gain amplifier,
   the first switch and the second switch being configured to output, via the first output terminal and the second output terminal, a differential output signal in accordance with (i) the gain control signal and (ii) the bandwidth control signal.

2. The variable gain amplifier of claim 1, further comprising a resistor coupled to the first inductor.

3. The variable gain amplifier of claim 1, further comprising a resistor coupled to the fifth switch.

4. The variable gain amplifier of claim 1, further comprising a sixth switch coupled to the fifth switch, the sixth switch comprising a sixth gate terminal coupled to a bias signal.

5. The variable gain amplifier of claim 1, wherein the first switch comprises an NMOS switch.

6. The variable gain amplifier of claim 1, further comprising a cross-coupled device coupled to the first switch and the second switch.

7. The variable gain amplifier of claim 1, wherein the third switch comprises a PMOS switch.

8. A variable gain amplifier comprising:
   a first switch comprising a first base terminal and a first collector terminal, the first base terminal being coupled to a first input voltage;
   a second switch comprising a second base terminal and a second collector terminal, the second base terminal being coupled to a second input voltage;
   a first output terminal coupled to the first collector terminal;
   a second output terminal coupled to the second collector terminal;
   a first inductor coupled to the first collector terminal;
   a second inductor coupled to the second collector terminal;
   a third switch comprising a first gate terminal and configured in parallel to the first inductor;
   a fourth switch comprising a second gate terminal and configured in parallel to the second inductor, the third switch and the fourth switch configured to receive, from a control module, a bandwidth control signal that varies a bandwidth of the variable gain amplifier; and a fifth switch configured to receive, from the control module, a gain control signal that varies a gain of the variable gain amplifier, the first switch and the second switch being configured to output, via the first output terminal and the second output terminal, a differential output signal in accordance with (i) the gain control signal and (ii) the bandwidth control signal.

9. The variable gain amplifier of claim 8, wherein the first switch comprises a bipolar junction transistor (BJT) switch.

10. The variable gain amplifier of claim 9, wherein the BJT switch is NPN type.

11. The variable gain amplifier of claim 9, wherein the third switch comprises a MOSFET transistor.

12. The variable gain amplifier of claim 8, wherein the first gate terminal is coupled to the gain control signal.

13. The variable gain amplifier of claim 9, wherein the gain control signal is characterized by a slope value and an offset value.

14. A receiver apparatus comprising:

an input terminal for receiving incoming data signals;

a variable gain amplifier coupled to the input terminal, the variable gain amplifier comprising a first switch and an inductor, the first switch being coupled to the input terminal, the first switch comprising (i) a source terminal coupled to a variable resistor and (ii) a drain terminal coupled to the inductor, the variable resistor being configured to receive, from a control module, a first control signal that varies a gain of the variable gain amplifier, the variable gain amplifier further comprising a second switch coupled in parallel with the inductor, the second switch being configured to receive, from the control module, a second control signal that varies a bandwidth of the variable gain amplifier; and an analog to digital converter (ADC) configured to generate a digital signal based on the incoming data signal, the ADC being coupled to the drain terminal.

15. The receiver apparatus of claim 14 further comprising a transimpedance amplifier for converting incoming optical signals to the incoming data signal.

16. The receiver apparatus of claim 14 wherein the variable gain amplifier further comprises the control module.

\* \* \* \* \*